US005235347A

United States Patent [19]

Lee

[11] Patent Number: 5,235,347

[45] Date of Patent: Aug. 10, 1993

[54] LIGHT EMITTING DIODE PRINT HEAD

[75] Inventor: Choo Boo Lee, Bukit Mertajam, Malaysia

[73] Assignee: Hewlett-Packard Company, Palo Alto, Calif.

[21] Appl. No.: 699,099

[22] Filed: May 13, 1991

[30] Foreign Application Priority Data

Sep. 7, 1990 [MY] Malaysia .......................... PI9001538

[51] Int. Cl.[5] .......................... G01D 15/14; H05K 7/20

[52] U.S. Cl. .......................... 346/107 R; 346/139 R; 346/145; 361/704; 361/707

[58] Field of Search ............... 346/107 R, 145, 139 R; 361/386, 387, 388, 389

[56] References Cited

U.S. PATENT DOCUMENTS 4,821,051 4/1989 Hediger .............................. 346/155
4,829,321 5/1989 Iizuka et al. .................... 346/107 R
5,014,074 5/1991 Dody et al. ...................... 346/107 R

FOREIGN PATENT DOCUMENTS 0031981 2/1985 Japan .............................. 346/139 R

*Primary Examiner*—Benjamin R. Fuller
*Assistant Examiner*—David Yockey

[57] ABSTRACT

A light emitting diode print head has an aluminum substrate or mother plate. A plurality of stainless steel tiles are assembled in a row on the substrate. Each of the tiles has a row of dice, each of which has a row of light emitting diodes. The tiles are assembled so that the LEDs are in a row extending across the print head with the adjacent LEDs at the edges of each of tile being a short distance apart. Compensation for differences in coefficient of thermal expansion between the tiles and substrate is provided by a pair of stainless steel strips adhesively bonded between the tiles and substrate. Each strip is bonded along an edge of the row of tiles away from the row of LEDs by a compliant adhesive. A thermally conductive compliant adhesive is provided between the tiles and substrate beneath the LEDs for heat transfer. The stainless steel strips serve as compensation for the difference in coefficient of thermal expansion between the tiles and substrate. There is a yield increase in print heads of at least 10% without any significant cost increase.

19 Claims, 1 Drawing Sheet

LIGHT EMITTING DIODE PRINT HEAD

BACKGROUND OF THE INVENTION

It has become desirable to employ non-impact printers for text and graphics. Xerographic techniques are employed in such non-impact printers. An electrostatic charge is developed on the surface of a moving drum or belt and selected areas of the surface are discharged by exposure to light. Alternatively, areas may be charged by illumination. A printing toner is applied to the drum and adheres to the areas having an electrostatic charge and does not adhere to the discharged areas. The toner is then transferred to a sheet of plain paper and is heat-fused to the paper. By controlling the areas illuminated and the areas not illuminated, characters, lines and other images may be produced on the paper.

One type of non-impact printer employs an array of light emitting diodes (LEDs) for exposing the photoreceptor drum surface. A line of minute LEDs is positioned next to a lens so that the images of the LEDs are arrayed across the surface to be illuminated. In some printers, multiple rows of LEDs may be used. As the surface moves past the line of LEDs, the LEDs are selectively activated to either emit light or not, thereby exposing or not exposing the surface of the drum in a pattern corresponding to the LEDs activated.

To obtain good resolution and image quality in such a printer, the physical dimensions of the LEDs must be quite small and very tight position tolerances must be maintained. Dimensional tolerances are often no more than a few micrometers.

At the lowest level of integration, a plurality of light emitting diodes are formed on gallium arsenide chips or dice by conventional techniques. The size and positions of the LEDs are controlled by well-established photolithographic techniques. The wafer on which the LEDs are formed is carefully cut into individual dice, each having a row of LEDs. In an exemplary embodiment, the length of such a die is cut to $\pm 2$ micrometers and the width is cut to $\pm 5$ micrometers. An exemplary die about 8 millimeters long may have 96 LEDs along its length.

Practical problems arise in arranging these LED-bearing dice in a line with the necessary precision for good image quality. Clearly economical as well as precise assembly techniques are important.

For purposes of exposition herein, the face of the LED die on which the LEDs are formed is referred to as the front and the opposite face as the back. The same nomenclature is used for the other parts of the assembly such as integrated circuit chips, mounting tiles and the like. In each case, the face facing in the same direction as the LEDs is referred to as the front.

It is also convenient to employ a coordinate system for the assembly. Thus, the x direction is along the line of LEDs. The y direction is in the plane of the LEDs perpendicular to the x direction. The z direction is normal to these and is the direction in which the light output from the LEDs is generally directed. It might be thought of as the height.

In an exemplary embodiment, a print-head with a length corresponding to the width of a sheet of business size paper has 2592 light emitting diodes. Close control of dimensions between adjacent LEDs is more significant than the total length of the array since the user is more sensitive to a line displacement or character imperfection in mid-page than a discrepancy in the total page width. Spacing of LEDs on a die is well controlled by photolithography. The spacing between LEDs at the ends of adjacent dice is an area of concern in assembling an LED print head. Typical tolerance between adjacent LEDs at the ends of dice can be as little as $\pm 15$ micrometers in the x direction.

Similarly, the tolerance in the y direction may be $\pm 25$ micrometers at the ends of adjacent dice, with a total "waviness" along the entire print-head of $\pm 75$ micrometers. Tolerance in the z direction may be $\pm 25$ micrometers to assure that light from the LEDs is sharply focused on the photoreceptor surface throughout the full length of the array.

A significant problem may be encountered in the assembly of print heads due to close tolerances in the x direction. One qualification test for print heads involves temperature cycling between $-30°$ C. and 65° C. In an exemplary embodiment the LED dice are basically gallium arsenide. A row of LED dice are mounted on a stainless steel tile. A row of such tiles are assembled on an aluminum substrate referred to as a mother plate. Gallium arsenide has a coefficient of thermal expansion as low as $3.8 \times 10^{-6}/°$ C. The coefficient of thermal expansion of a representative aluminum alloy is $23.6 \times 10^{-6}/°$ C. The coefficient of thermal expansion of the steel tiles is in between these extremes.

When such a print head assembly is subjected to thermal cycling to low temperature, an LED die at the edge of one tile may "crash" into the LED die at the edge of the adjacent tile. Pressure between adjacent dice may cause chipping or cracking of such a die, which may damage one or more LEDs or their electrical connections. As many as 10% of print heads may show such cracking or chipping due to the adjacent LEDs being too close together. On the other hand, the dice cannot be spaced too far apart since broad spacing may leave a noticeable gap. Thus, there is a very tight tolerance on spacing of dice on the print head. An appreciable number of print heads fail to meet the upper limit of specified tolerance.

It is desirable to minimize the problem of contact between LED dice on assembled print heads and relax the stringency of the spacing tolerances. However, any solution to this problem should not, itself, have an adverse effect on cost or reliability. Some increase in cost is, of course, tolerable if reliability is sufficiently enhanced. It is important that the x, y and z tolerances are not compromised. Furthermore, a solution to this problem should not introduce different problems for other reliability testing such as high temperature soaking, vibration tests and the like.

BRIEF SUMMARY OF THE INVENTION

There is, therefore, provided in practice of this invention according to a presently preferred embodiment, a light emitting diode print head comprising a metal substrate with a plurality of metal tiles in row on the substrate, with each tile having a row of light emitting diodes on its front face. The metal substrate and the tiles have different coefficients of thermal expansion. A metal thermal compensation layer is provided between the substrate and the tiles with a coefficient of thermal expansion different from the coefficient of thermal expansion of the substrate and closer to the coefficient of thermal expansion of the tiles. Compliant adhesive layers are used between the thermal compensation layer and the substrate and tiles, respectively. Preferably the thermal compensation layer comprises a pair of metal strips with one strip extending along each edge of the row of tiles with a gap between the metal strips underlying the row of light emitting diodes. A layer of compliant adhesive may also be provided between the tiles and the substrate in the gap between the strips for heat conduction.

BRIEF DESCRIPTION OF THE DRAWINGS

These and other features and advantages of the present invention will be appreciated as the same becomes better understood by reference to the following detailed description when considered in connection with the accompanying drawings wherein.

DETAILED DESCRIPTION

Figure 1:
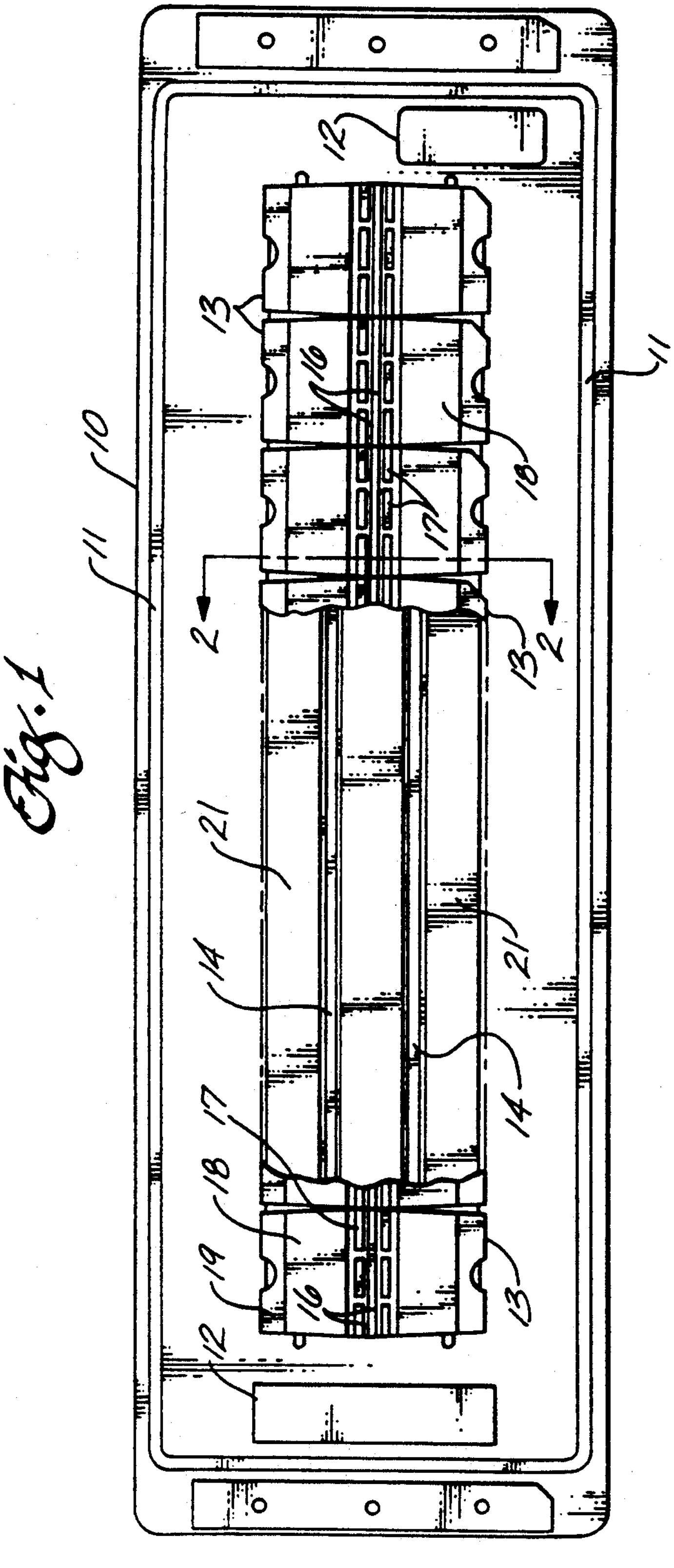
FIG. 1 is a plan view of the front face of an LED print head assembly constructed according to principles of this invention.
Figure 2:
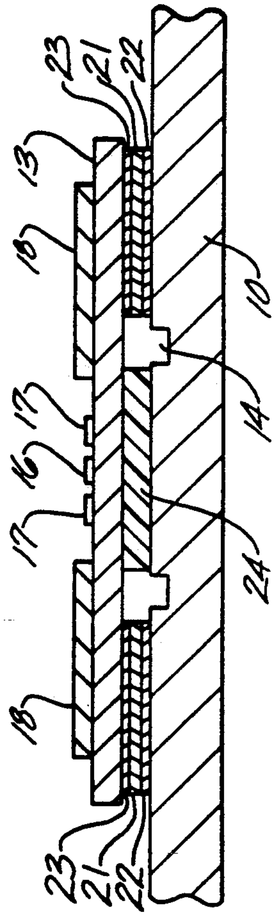
FIG. 2 is a fragmentary cross-section of the subsystem assembly fixture along line 2—2.

The foundation for the print head is an aluminum alloy mother plate 10 which can be fastened into a printer by means which are not material to this description. The front face of the mother plate has a peripheral groove 11 which receives the edge of a cover (not shown) which supports a lens for focusing the image of the LEDs onto a photo-receptor drum or the like. Near each end of the mother plate there are conventional electrical connectors 12 for bringing signals and power into the assembly. The mother plate serves as a ground plane for the LEDs and integrated circuits mounted in the assembly.

Nine mounting tiles 13 are arranged in a row along the length of the mother plate. The tiles are adhesively bonded to the front face of the mother plate as described in greater detail hereinafter. A pair of parallel grooves 14 extend along the length of the plate for keeping different types of adhesive separate from each other.

A row of LED dice 16 lies along the center of the assembly. Each die is about eight millimeters long and about a millimeter in width. Three such dice are cemented to the front face of each of the tiles by an electrically conductive silver-filled epoxy adhesive. On each side of the row of LED dice on each tile, there is a row of three integrated circuit chips 17. Electronic signal processing is conducted on the integrated circuit chips for supplying a current to selected light emitting diodes, as desired, during operation of the assembly.

Outboard from the row of integrated circuit chips on each side of the center line, there is a conventional printed circuit board 18 cemented to the front face of each tile. Besides receiving electrical connections from the connectors 12, the printed circuit boards may also serve as mounting for trimming resisters, blocking capacitors, and other discrete components. Wire bonded electrical connections (not shown) are provided between the PC boards and the integrated circuit chips associated therewith. Similarly, wire bonded electrical connections are made between the chips and the LED dice. Wire bonding is also used for grounding connections between the tiles and substrate. Electrical connections within the assembly are omitted from the illustration for clarity since they form no part of this invention.

The LEDs are precisely located on the dice by reason of the dice being carefully cut after the LEDs are fabricated. The LED dice are then accurately positioned on the tiles. Finally, the tiles are accurately positioned on the mother plate. Thus, the LEDs are precisely positioned on the mother plate.

It might be noted that the tiles are not precisely rectangular. It is desirable to have an almost unnoticeable chamfer on each side of the tile extending from the locus of the LED dice near the center of the tile toward each lateral edge. A chamfer of as little as 1° has been found appropriate. The chamfer is exaggerated in the drawing.

The mounting tiles are made of stainless steel which receives thin electroless nickel plating and gold plating for preventing oxidation films that would increase electrical contact resistance. Stainless steel is employed as a substrate since it has a coefficient of thermal expansion sufficiently close to the coefficient of thermal expansion of the gallium arsenide LED dice and silicon integrated circuit chips to avoid breakage of these brittle components during low temperature excursions. An exemplary coefficient of thermal expansion of a type 410 martensitic stainless steel is about $9.9\times10^{-6}/°$ C. Differences in coefficient of expansion between the steel and the semiconductor components are accommodated in the adhesive.

The mother plate is preferably made of chromate conversion coated aluminum alloy such as A360-T2 for lighter weight and better thermal and electrical conductivity than stainless steel. The coefficient of thermal expansion of the A360 alloy in the T-2 condition is about $23.6\times10^{+6}/°$ C.

Instead of adhesively bonding the stainless steel tiles directly to the aluminum alloy substrate, as has previously been the practice, a thermal compensation layer 21 is interposed. In a preferred embodiment the thermal compensation layer comprises a pair of very thin stainless steel shims 21 about one centimeter wide and fifty micrometers thick extending the full length of the row of tiles. There is one such metal shim between the tiles and the substrate along each edge of the tiles outboard from the parallel grooves 14 in the substrate.

In one embodiment the stainless steel of the shims is the same alloy as the tiles. In other words type 410 stainless steel is used for both the tiles and shims. In such an embodiment, the coefficients of thermal expansion of both the tiles and the shims are substantially the same. This essentially completely decouples the tiles from any expansion difference of the substrate.

In another embodiment the stainless steel layer between the tiles and the substrate is an alloy different from the tiles and with a coefficient of thermal expansion intermediate between the coefficients of the tiles and substrate, respectively. For example, a type 304 stainless steel may be used with a coefficient of thermal expansion of about $15.5\times10^{-6}/°$ C., which is about half way between the coefficients of type 410 stainless steel and the aluminum alloy substrate.

When using a shim with a coefficient of thermal expansion having a desired relation to the coefficients of the tiles and the substrate, alloys other than steels may be used to select a desired coefficient. A desired coefficient may also be obtained with laminated shims of different metals. For example, a copper-molybdenum-copper three layer laminate may be used for obtaining a coefficient close to that of the tiles. By varying the relative thicknesses of the layers, one can obtain a desired coefficient of thermal expansion of the laminate.

The shims are secured to the substrate and the tiles are secured to the shims by compliant adhesive layers 22 and 23, respectively. Thus, shear stress which may be introduced by reason of differences in coefficient of thermal expansion between adjacent materials are accommodated in the compliant adhesive layers.

An exemplary adhesive layer 22 between the shims and substrate comprises a double sided pressure sensitive adhesive tape such as 3M-467-MP available from Minnesota Mining and Manufacturing Co., St. Paul, Minnesota. This pressure sensitive adhesive tape is compliant or somewhat elastomeric so that it can deform when subjected to shear stress, even at the low temperature of −30° C.

A suitable adhesive for bonding the tiles to the shims comprises Dymax 628T using activator 535, both of which are available from Dymax Corporation, Torrington, Connecticut. This is an acrylic adhesive which is also compliant for deformation under shear loading due to differential thermal expansion. Typical average thickness of the bond line between the substrate and tiles is about 150 micrometers, namely about 50 micrometers each for the pressure sensitive adhesive, the metal shim and the acrylic adhesive.

It is also desirable to provide a thermal conduction path between the center portion of the tiles and the underlying substrate. There is heat generated during operation of the LEDs and it is desirable to dissipate that heat from the tiles to the underlying aluminum substrate. For this reason the gap between the tiles and substrate between the grooves 14 in the substrate is filled with a compliant thermally conductive adhesive such as Sylgard 170, a silicone adhesive available from Dow-Corning Corp., Midland, Michigan. The bonding surfaces are preferably primed with primer 1200 for providing a reliable contact for good thermal conduction.

If desired, a conventional silver loaded adhesive, such as an epoxy resin, may be used for higher thermal conductivity. The material between the center portion of the tiles and the substrate should be selected for its ability to deform under the shear stress of differential thermal expansion between the tiles and substrate, good thermal conductivity, and its "gap filling" capability to assure an appreciable contact area for conducting heat.

An LED print head as described may be assembled as follows. Tiles are prepared with printed circuit boards, silicon chips and a row of LED dice in a conventional manner. An aluminum mother plate is surface ground to a desired degree of flatness, also in a conventional manner. A pressure sensitive adhesive is applied to either the substrate outboard from the grooves 14 or to one face of each of a pair of shims. The shims are then positioned on the substrate and pressed in place by a rubber or metal roller.

One component of the liquid Dymax adhesive is silk screened on the exposed face of the thermal compensation shims and the other component is silk screened on the tiles. A gap filling adhesive is applied to the substrate in the area between the grooves 14. The tiles are then assembled on the resultant three stripes of adhesive. Alternatively, the tiles may be assembled in their desired locations inverted on a precision fixture and then the aluminum mother plate is assembled over the top. This helps maintain z axis precision.

When the tiles are placed on the substrate the Dymax adhesive commences curing as soon as contact is made with the activator. Sufficient strength to hold the tiles in place is obtained in a minute or so. Total curing of both adhesives occurs after several hours at room temperature. The only difference between the assembly technique for this LED print head and a prior LED print head is the application of the pressure sensitive adhesive and thermal compensator shims along each edge of the tiles. A somewhat somewhat thicker layer of thermal coupling material between the center portion of the tiles and substrate is also used.

Since the thermal compensation layer is quite thin and flexible, it does not introduce any significant mechanical bowing in the final assembly of the print head and does not adversely impact the z axis tolerances. It does not contribute to any significant increase in the cost or weight of the print head. With the extra thickness of adhesive, built up stresses in the adhesives at extreme temperature conditions are alleviated. The direct thermal path from the tiles to the substrate is not compromised.

Surprisingly, there is an additional increase in yield beyond a 10% improvement obtained by eliminating concern about contact between adjacent LEDs at the edges of adjacent tiles. The minimization of thermal expansion concerns permits a somewhat larger tolerance range for assembly of adjacent LEDs, thereby minimizing the number of print heads that fall outside of tolerances. This improvement in yield is obtained without changing any other manufacturing techniques.

Print heads made with a thermal expansion compensation layer have proved quite reliable in accelerated life testing. The problem of cracking and chipping of LED dice and yield losses due to gaps too large between dice have been essentially eliminated. In a prior print head without shims, experience showed a failure rate of about 13% due to die cracking or chipping during low temperature cycling. To avoid this problem, dice were deliberately gapped further apart, and as a consequence another 5% failed to fall within the upper tolerance limit for gap width. Over a six month period, total rejects due to oversize gap and cracking problems were about 18.5%.

On the other hand, after assembling print heads with type 410 stainless steel tiles and type 304 stainless steel shims, failures due to chipping or oversize gaps essentially disappeared. Over 2000 such print heads have been built without any failures due to these causes.

The test for temperature cycling involves repeated cycles between −30° C. and 65° C. with one hour dwell at each extreme temperature and one hour at room temperature in between. Typically, a print head may be subjected to fifty such cycles. During such cycling the substrate must remain flat, that is, it is not warped due to thermal stresses, so that z axis tolerances are met. The shims caused no change in this parameter. The adhesive securing the tiles in the assembly must remain intact, and no cracking or chipping of the LED dice must occur. Print heads with shims readily pass this test.

One print head with shims was subjected to a shear test to evaluate adhesive bonding following fifty such temperature cycles. Adhesion remained good and failure of the adhesive was 100% cohesive, that is, the locus of failure was entirely within the adhesive rather than at the bond line between the adhesive and substrate or tile. This indicates good adhesion. By comparison, a similar head without shims had only 20% cohesive failure in a similar test.

Another accelerated life test is resistance to degradation following soaking at elevated temperature and high humidity. The test involves holding the heads at a temperature of 85° C. and relative humidity of 85%. Heads with shims have survived 55 hours of such 85/85 soaking without any lifting of tiles or shims. This can be compared with prior heads without shims in which the adhesive between tiles and substrate often fails after 24 hours of 85/85 soaking. Such failure is believed to be related to the high difference between the coefficients of thermal expansion of the tiles and substrate. This difference is compensated for in a print head with shims as described.

A related test stores print heads at 50° C. and 90% relative humidity for 360 hours. Although both an evaluation head and a control head showed some decrease in adhesion strength, adhesion remained satisfactory. When tiles were pried off with a screwdriver, failure mode was 100% adhesive in both heads.

A high temperature operating life test operates the LEDs for 330 hours while subjected to a temperature of 70° C. A shear test showed 100% cohesive failure in a head with shims and about 50% in a head without shims. Generally speaking, adhesion strength remained quite good. In none of these tests were there adverse changes in the x, y or z alignments.

Although limited embodiments of LED print head have been described and illustrated herein, it will be understood that many modifications and variations are possible. For example, electrically conductive adhesive may used between the tiles and the aluminum mother plate so that the latter serves as a ground plane without separate wire bonds. In fact, any of a variety of compliant adhesives may be used between the components of the print head. The specific materials used in the preferred embodiment may have equivalents that could readily be substituted by those skilled in the art. Thus, within the scope of the appended claims, the invention may be practiced otherwise than as specifically described.

What is claimed is:

1. A light emitting diode print head comprising:

an aluminum alloy substrate;

a plurality of flat stainless steel tiles extending in a row on the substrate, each of said tiles including a plurality of light emitting diodes on a face of each of said tiles opposite to the face of the tile which is adjacent to the substrate and having a coefficient of thermal expansion different from a coefficient of thermal expansion of the aluminum substrate and closer to a coefficient of thermal expansion of the light emitting diodes; and a stainless steel thermal compensation layer having a coefficient of thermal expansion similar to the coefficient of thermal expansion of each of the tiles, the thermal compensation layer being adhesively bonded between the substrate and the tiles by a compliant pressure sensitive adhesive layer between the thermal compensation layer and the substrate, and a compliant adhesive layer between the thermal compensation layer and the tiles.

2. A light emitting diode print head as recited in claim 1 comprising a compliant adhesive layer between the thermal compensation layer and the tiles.

3. A light emitting diode print head as recited in claim 1 wherein the thermal compensation layer has a thickness of about 50 micrometers.

4. A light emitting diode print head as recited in claim 1 further comprising a compliant adhesive layer extending directly between the substrate and a portion of each of the tile opposite to the light emitting diodes.

5. A light emitting diode print head as recited in claim 1 wherein the thermal compensation layer comprises a pair of metal strips spaced apart from each other along edges of the tiles with the light emitting diodes being in a middle portion of the tiles between the edges of the tiles adjacent to the strips.

6. A light emitting diode print head comprising:

an elongated metal substrate;

a row of metal tiles along the metal substrate, the metal tiles each having a coefficient of thermal expansion different from a coefficient of thermal expansion of the metal substrate;

a row of light emitting diode dice on each of the metal tiles, the row of dice on each of the tiles collectively forming a row of light emitting diode dice extending along the length of the substrate;

a pair of metal shims extending along the length of the substrate, each each of the metal shims being between the tiles and the substrate along a portion of the tiles remote from the light emitting diode dice and having a coefficient of thermal expansion similar to the coefficient of thermal expansion of the tiles;

means for adhesively bonding the metal shims to the substrate and for adhesively bonding the tiles to the shims; and a layer of compliant adhesive for thermal transfer directly between the substrate and a portion of the tiles opposite the light emitting diode dice.

7. A light emitting diode print head as recited in claim 6 wherein the substrate comprises an aluminum alloy, the tiles comprise stainless steel, and the shims comprise stainless steel.

8. A light emitting diode print head as recited in claim 7 wherein the shims each have a thickness of about 50 micrometers.

9. A light emitting diode print head comprising:

an elongated aluminum alloy substrate;

a row of substantially rectangular stainless steel tiles extending along the length of the aluminum substrate on a front face of the substrate;

a row of light emitting diode dice extending across a center portion of a front face of each of the tiles, the row of dice on each of the tiles collectively forming a row of light emitting diode dice extending along the length of the substrate;

a pair of stainless steel shims extending along the length of the substrate, each metal shim being between the front face of the substrate and an edge of the tiles remote from the light emitting diode dice;

compliant means for adhesively bonding the metal shims to the front face of the substrate;

means for adhesively bonding back faces of the tiles to the shims; and a compliant adhesive layer directly between the substrate and a portion of the tiles opposite the light emitting diode dice for transferring heat.

10. A light emitting diode print head as recited in claim 9 wherein each of the shims has a thickness of about 50 micrometers.

11. A light emitting diode print head as recited in claim 9 wherein the means for bonding the shims to the substrate comprises a pressure sensitive adhesive.

12. A light emitting diode print head as recited in claim 9 wherein the stainless steel of each of the shims is identical to the stainless steel of the tiles.

13. A light emitting diode print head as recited in claim 9 wherein the stainless steel of each of the shims is different from the stainless steel of the tiles and has a coefficient of thermal expansion intermediate between the coefficients of thermal expansion of the steel of the tiles and the aluminum of the substrate.

14. A light emitting diode print head comprising:
an aluminum alloy substrate;
a plurality of stainless steel tiles extending in a row along the substrate;
a plurality of light emitting diode dice arranged in a row on each of the tiles, each of said light emitting diode dice having a row of light emitting diodes collectively forming a row of light emitting diodes on the row of tiles with light emitting diodes in the collective row being equal distances apart;
a pair of strips of metal, each of the strips extending along a lateral edge of the row of tiles, with a gap between the metal strips underlying the row of light emitting diode dice forming a thermal compensation layer between the substrate and the tiles and having a coefficient of thermal expansion different from a coefficient of thermal expansion of the substrate and closer to a coefficient of thermal expansion of the tiles;
a compliant adhesive layer between the thermal compensation layer and the substrate;
a compliant adhesive layer between the thermal compensation layer and the tiles; and
a layer of compliant adhesive between the tiles and the substrate in the gap.

15. A light emitting diode print head as recited in claim 14 wherein the thermal compensation layer has a coefficient of thermal expansion approximately equal to the coefficient of thermal expansion of the tiles.

16. A light emitting diode print head as recited in claim 14 wherein the thermal compensation layer has a coefficient of thermal expansion intermediate between the coefficient of thermal expansion of the tiles and the coefficient of thermal expansion of the substrate.

17. A light emitting diode print head as recited in claim 14 wherein the adhesive layer between the thermal compensation layer and the substrate comprises a pressure sensitive adhesive.

18. A light emitting diode print head comprising:
an elongated metal substrate;
a row of metal tiles along the metal substrate, the metal tiles having a coefficient of thermal expansion different from a coefficient of thermal expansion of the metal substrate;
a row of light emitting diode dice on each of the metal tiles, the row of dice on each of the tiles collectively forming a row of light emitting diode dice extending along the length of the substrate;
a pair of metal shims extending along the length of the substrate, each of the metal shims being between the tiles and the substrate along a portion of the tiles remote from the light emitting diode dice and having a coefficient of thermal expansion intermediate between the coefficient of thermal expansion of the tiles and the coefficient of thermal expansion of the substrate;
a compliant pressure sensitive adhesive layer for adhesively bonding the metal shims to the substrate;
a compliant adhesive layer for adhesively bonding the tiles to the shims; and
a compliant adhesive layer between the tiles and the substrate beneath the row of light emitting diode dice in a gap between the shims for thermal transfer directly between the substrate and a portion of the tiles opposite the light emitting diode dice.

19. A light emitting diode print head as recited in claim 18 wherein the shims have a coefficient of thermal expansion approximately equal to the coefficient of thermal expansion of the tiles and significantly different from the coefficient of thermal expansion of the substrate.

* * * * *